United States Patent [19]
Mizuno

[11] Patent Number: 5,592,127
[45] Date of Patent: Jan. 7, 1997

[54] VOLTAGE-CONTROLLED OSCILLATOR WITH REDUCED PHASE DIFFERENCE

[75] Inventor: Masayuki Mizuno, Tokyo, Japan

[73] Assignee: NEC Corporation, Tokyo, Japan

[21] Appl. No.: 520,988

[22] Filed: Aug. 30, 1995

[30] Foreign Application Priority Data

Aug. 30, 1994 [JP] Japan .................................. 6-204079

[51] Int. Cl.⁶ ........................................................ H03B 5/24
[52] U.S. Cl. ........................... 331/57; 331/55; 331/172; 331/175; 331/177 R
[58] Field of Search .................................. 331/45, 46, 55, 331/57, 143, 153, 172, 173, 175, 177 R

[56] References Cited

U.S. PATENT DOCUMENTS 5,357,217  10/1994  Marchesi et al. ........................ 331/57

OTHER PUBLICATIONS

John G. Maneatis et al., "Precise Delay Generation Using Coupled Oscillators", IEEE Journal of Solid–Circuits, vol. 28, No. 12, Dec. 1993, pp. 1273–1282.

Primary Examiner—David Mis
Attorney, Agent, or Firm—Foley & Lardner

[57] ABSTRACT

A voltage-controlled oscillator has ring oscillators R1, R2 and R3 which have three amplifier elements A1–A3, A4–A6 and A7–A9 respectively which are connected in the form of a ring. The way of connecting with the respective amplifier elements A10 to A18 is as follows: First, optionally selecting two output terminals from the 3×3 amplifier elements which form three ring oscillators, wherein the two output terminals are not selected from the input and output terminals of one amplifier element, and wherein the two output terminals are not selected from the output terminals belonging to the same ring oscillator. Next, connecting the input and output terminals of one of the amplifier elements A10 to A18 to the optionally selected two output terminals. Then repeating the above procedures one or more times to form a network between the ring oscillators R1 to R3. C1 to C9 are nodes for the connections. In the above connections, it is important that none of the two output terminals which are optionally selected from the output terminals of the 3×3 amplifier elements which form three ring oscillators have both in-phase and anti-phase paths through between them, on condition that all the signal paths between the two output terminals selected do not pass more than one time through the same output terminal.

4 Claims, 8 Drawing Sheets

A1-18 : AMPLIFIER ELEMENTS
R1-3 : RING OSCILLATORS
C1-9 : NODES

A1-18 : AMPLIFIER ELEMENTS
R1-3 : RING OSCILLATORS
C1-9 : NODES

A1-18 : AMPLIFIER ELEMENTS
R1-3 : RING OSCILLATORS
C1-9 : NODES

A1-18 : AMPLIFIER ELEMENTS
R1-3 : RING OSCILLATORS
C1-9 : NODES

A13-15 : AMPLIFIER ELEMENTS

A1-15 : AMPLIFIER ELEMENTS
R1-3 : RING OSCILLATORS
D1-D3 : DELAY UNITS

A12,13 : AMPLIFIER ELEMENTS
D2 : DELAY UNITS

VOLTAGE-CONTROLLED OSCILLATOR WITH REDUCED PHASE DIFFERENCE

FIELD OF THE INVENTION

This invention relates to a voltage-controlled oscillator, and more particularly to, a voltage-controlled oscillator in which the fluctuation of an output clock which occurs due to changes in operation environment is reduced.

BACKGROUND OF THE INVENTION

A conventional ring-type voltage-controlled oscillator in general comprises amplifier elements of number N (N is an odd number) which can change a delay time established between input and output by a signal input from a delay-time control terminal and have input and output terminals and function as an inverting amplifier, wherein the respective input and output terminals are connected in the form of a ring.

However, the conventional voltage-controlled oscillator has a problem that it trends to bring the dispersed quality of the delay time in the amplifier elements and a relatively high temporal fluctuation of the output clock, i.e., jittering, due to dispersed quality in devices that comprise the voltage-controlled oscillator, changes in operation environment caused by changes in voltage of power supply or the like, the noise induced from outside and the like. In particular, since a fluctuation in phase difference between output clocks occur when obtaining an output clock from two or more output clock terminals, it is necessary for a system that makes a timing for a synchronization circuit by a voltage-controlled oscillator to be designed with having a margin for such fluctuation.

SUMMARY OF THE INVENTION

Accordingly, it is an object of the invention to provide a voltage-controlled oscillator in which the fluctuation of the output clock which occurs by changes in operation environment is reduced.

According to one aspect of the invention, a voltage-controlled oscillator, comprises:

oscillators of number M each of which includes amplifier elements of odd number N which function as inverting amplifiers and are connected in the form of a ring, and which include an input terminal, an output terminal and a delay-time control terminal, wherein delay time is controlled from outside by the delay-time control terminal, wherein the oscillators form a network by repeating one or more time a procedure that two output terminals are optionally selected from the amplifier elements of total number M×N, the two output terminals not being input and output terminals of one of the amplifier element and not being output terminals belonging to one of the oscillators, then the two output terminals are connected to input and output terminals of an another amplifier element, wherein none of the two output terminals have both in-phase and anti-phase paths through between them, on condition that all signal paths laid between the two output terminals does not pass more than one time through the same output terminal.

According to another aspect of the invention, a voltage-controlled oscillator, comprises:

oscillators of number M each of which includes amplifier elements of odd number N which function as inverting amplifiers and are connected in the form of a ring, and which include an input terminal, an output terminal and a delay-time control terminal, wherein delay time is controlled from outside by the delay-time control terminal, wherein the oscillators form a network by repeating M×N times a procedure that two output terminals are optionally selected from the amplifier elements of total number M×N, the two output terminals not being input and output terminals of one of the amplifier element and not being output terminals belonging to one of the oscillators, then the two output terminals are connected to input and output terminals of an another amplifier element, wherein more than three of input or output terminals of the amplifier elements of total number M×N are not included into any loop being formed by the amplifier elements, wherein none of the two output terminals have both in-phase and anti-phase paths through between them, on condition that all signal paths laid between the two output terminals does not pass more than one time through the same output terminal.

According to third aspect of the invention, a voltage-controlled oscillator, comprises:

oscillators of number M each of which includes amplifier elements of odd number N which function as inverting amplifiers and are connected in the form of a ring, and which include an input terminal, an output terminal and a delay-time control terminal, wherein delay time is controlled from outside by the delay-time control terminal, and delay units of number N each of which includes amplifier elements of odd number M which function as inverting amplifiers and are linearly connected, and which include an input terminal, an output terminal and a delay-time control terminal, wherein delay time is controlled from outside by the delay-time control terminal, wherein the amplifier elements are connected to form a two-dimensional network, an output terminal of one of the delay units is connected to an input terminal of another of the delay units in which the input terminal is not connected, wherein none of two output terminals optionally selected from M×N amplifier elements which are included in the oscillators of number M have both in-phase and anti-phase paths through between them, on condition that all signal paths laid between the two output terminals does not pass more than one time through the same output terminal.

According to fourth aspect of the invention, a voltage-controlled oscillator, comprises:

oscillators of number M each of which includes amplifier elements of odd number N which function as inverting amplifiers and are connected in the form of a ring, and which include an input terminal, an output terminal and a delay-time control terminal, wherein delay time is controlled from outside by the delay-time control terminal, and delay units of number N each of which includes amplifier elements of odd number M-1 which are linearly connected, and which include an input terminal, an output terminal and a delay-time control terminal, wherein delay time is controlled from outside by the delay-time control terminal, wherein respective input and output terminals of each of the delay units are connected to one of output terminals of M×N amplifier elements which are included in the oscillators of number M, the amplifier elements are connected to form a two-dimensional network, wherein none of two output terminals optionally selected from the M×N amplifier elements have both in-phase and anti-phase paths through between them, on condition that all signal paths laid between the two output terminals does not pass more than one time through the same output terminal.

Conventional voltage-controlled oscillators are in general of a ring oscillator type in which a plurality of amplifier elements are connected in the form of a ring. The oscillation frequency of the ring oscillator is brought as $1/(2 \times N \times t_{pd})$, where $t_{pd}$ is the delay time of an amplifier element and N is the number of the amplifier elements. Here, when the delay time of each amplifier element is varied due to dispersed quality of the device, variation of voltage of a power supply, noise induced from outside and the like, the oscillation frequency of the amplifier element will present temporal fluctuation, i.e., jittering. Furthermore, when an output is simultaneously obtained from a plurality of output terminals of amplifier elements, the timing between signals obtained from the output terminals will be subject to fluctuation.

The voltage-controlled oscillator according to the invention is designed so that a plurality of ring oscillators each of which has amplifier elements connected in the form of a ring are provided and they are connected to one another to form a network. In addition, it satisfies the condition that none of two output terminals optionally selected from all amplifier elements which are included in the oscillators have both in-phase and anti-phase paths through between them, on condition that all signal paths between the two output terminals do not pass more than one time through the same output terminal. Therefore, it can serve as a stable oscillator. Namely, even if dispersed quality of a device, variation of voltage of a power supply, a noise induced from outside or the like affects to vary the delay time of the amplifier element which comprises the voltage-controlled oscillator, a temporal fluctuation of output clock can be prevented since the amplifier elements are connected to form a network. In particular, when output is obtained from output terminals of a plurality of amplifier elements, a temporal timing fluctuation between signals obtained from output terminals can significantly be reduced.

BRIEF DESCRIPTION OF THE DRAWINGS

The invention will be explained in more detail in conjunction with the appended drawings, wherein.

DESCRIPTION OF THE PREFERRED EMBODIMENTS

Figure 1:
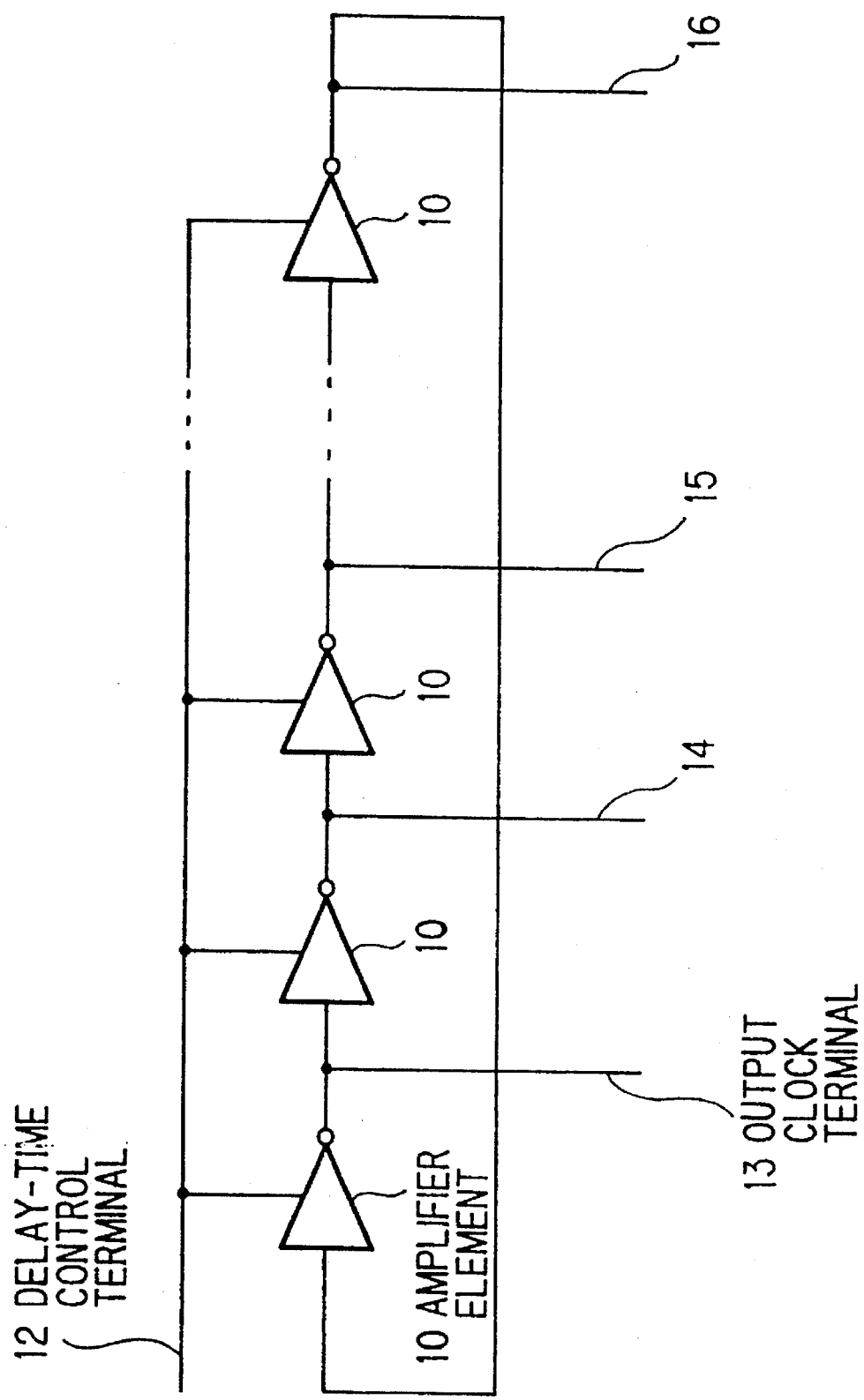
FIG. 1 is a circuit diagram showing a conventional voltage-controlled oscillator.

Before explaining a voltage-controlled oscillator in the preferred embodiment, an example of the aforementioned conventional voltage-controlled oscillator will be explained with a circuit diagram in FIG. 1.

The conventional voltage-controlled oscillator comprises amplifier elements of number N (N is an odd number) which can change a delay time established between input and output by a signal input from a delay-time control terminal 12 and have a input and output terminals and function as an inverting amplifier, wherein the respective input and output terminals are connected in the form of a ring. The respective amplifier elements 10 comprise an inverter gate which includes a P-channel transistor, N-channel transistor and the like. An output clock is obtained by using any or all of clock terminals 13, 14, 15, . . . 16.

As mentioned before, the conventional voltage-controlled oscillator trends to bring a dispersion of the delay time in the amplifier elements and a relatively high temporal fluctuation of the output clock, i.e., jittering, due to dispersed quality in devices that comprise the voltage-controlled oscillator, changes in operation environment caused by changes in voltage of power supply or the like, the noise induced from outside and the like.

Next, the preferred embodiments of the invention will be explained in FIGS. 2 to 9.

FIGS. 2 to 7 are circuit diagrams showing voltage-controlled oscillators in the first to sixth embodiments, respectively. In FIGS. 2 to 7, a delay-time control terminal of an amplifier element and output clock terminal are omitted.

Figure 6:
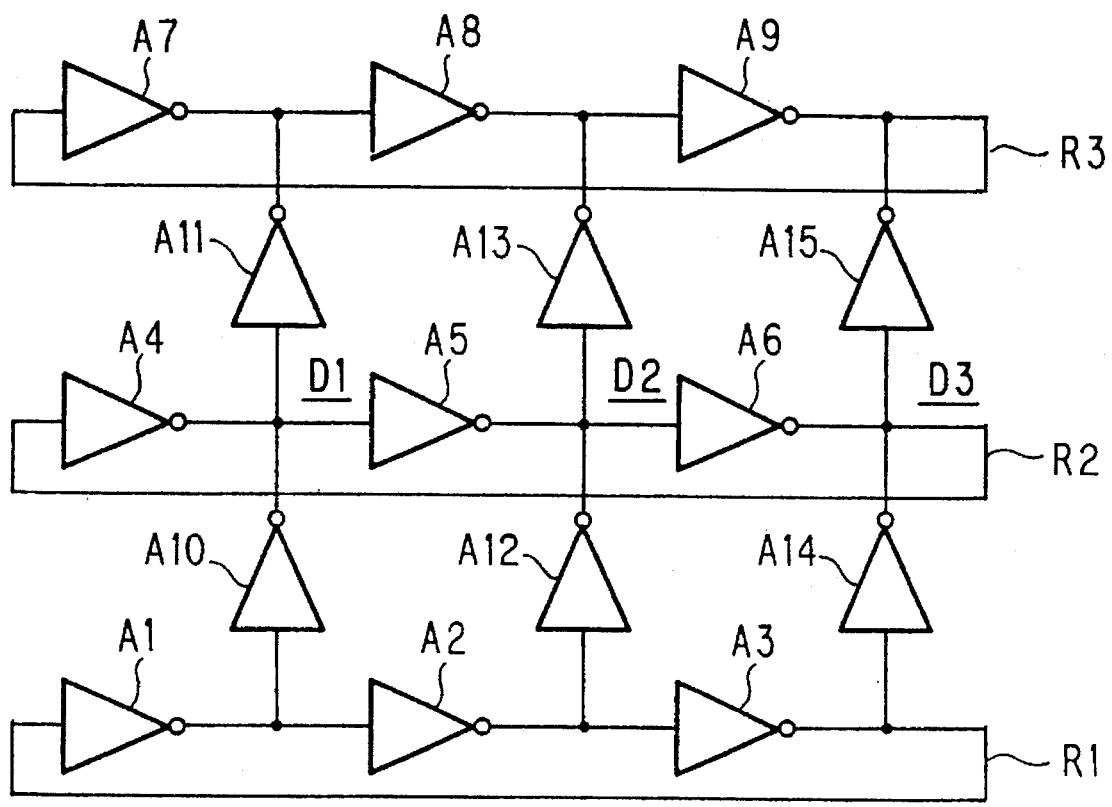
FIG. 6 is a circuit diagram showing a voltage-controlled oscillator in a fifth preferred embodiment according to the invention.
Figure 7:
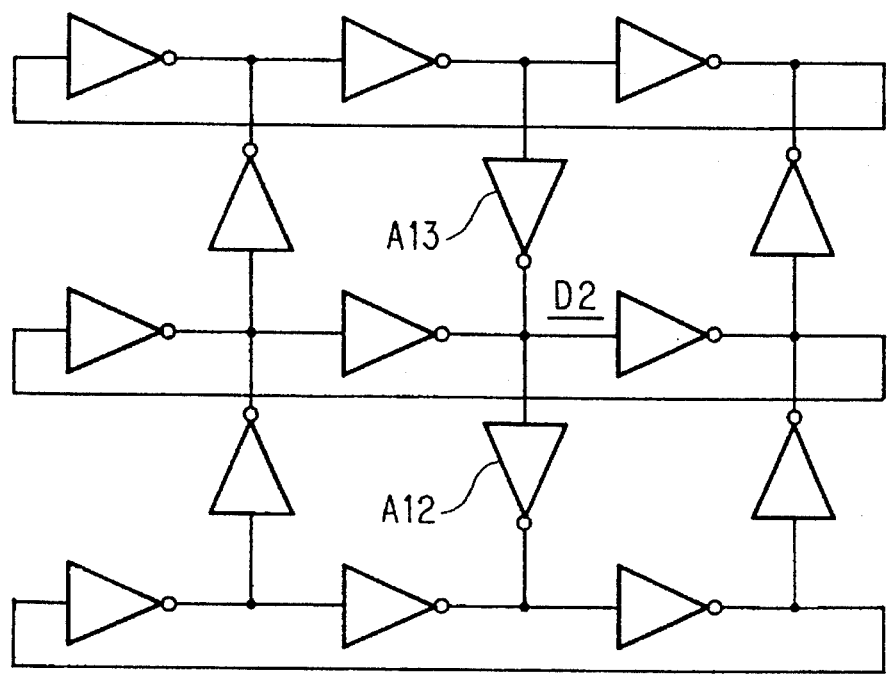
FIG. 7 is a circuit diagram showing a voltage-controlled oscillator in a sixth preferred embodiment according to the invention.
Figure 8:
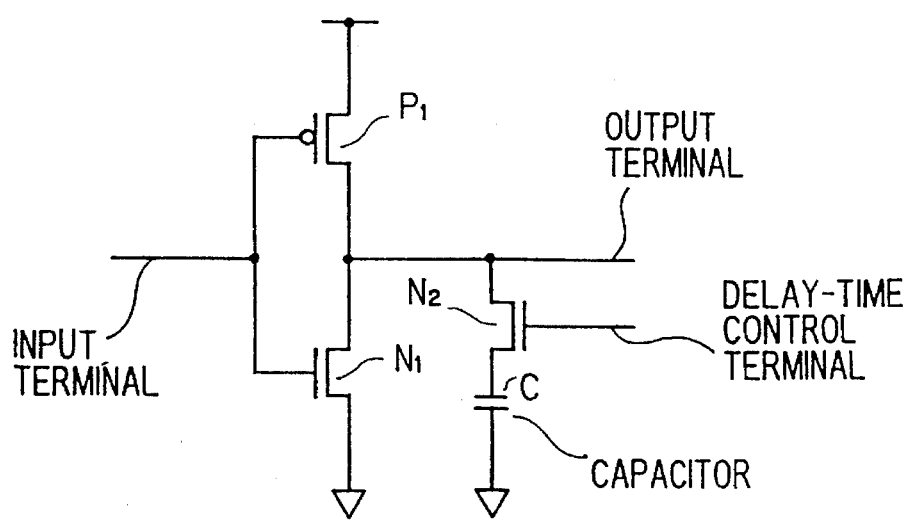
FIG. 8 is a circuit diagram showing an example of an amplifier element.
Figure 9:
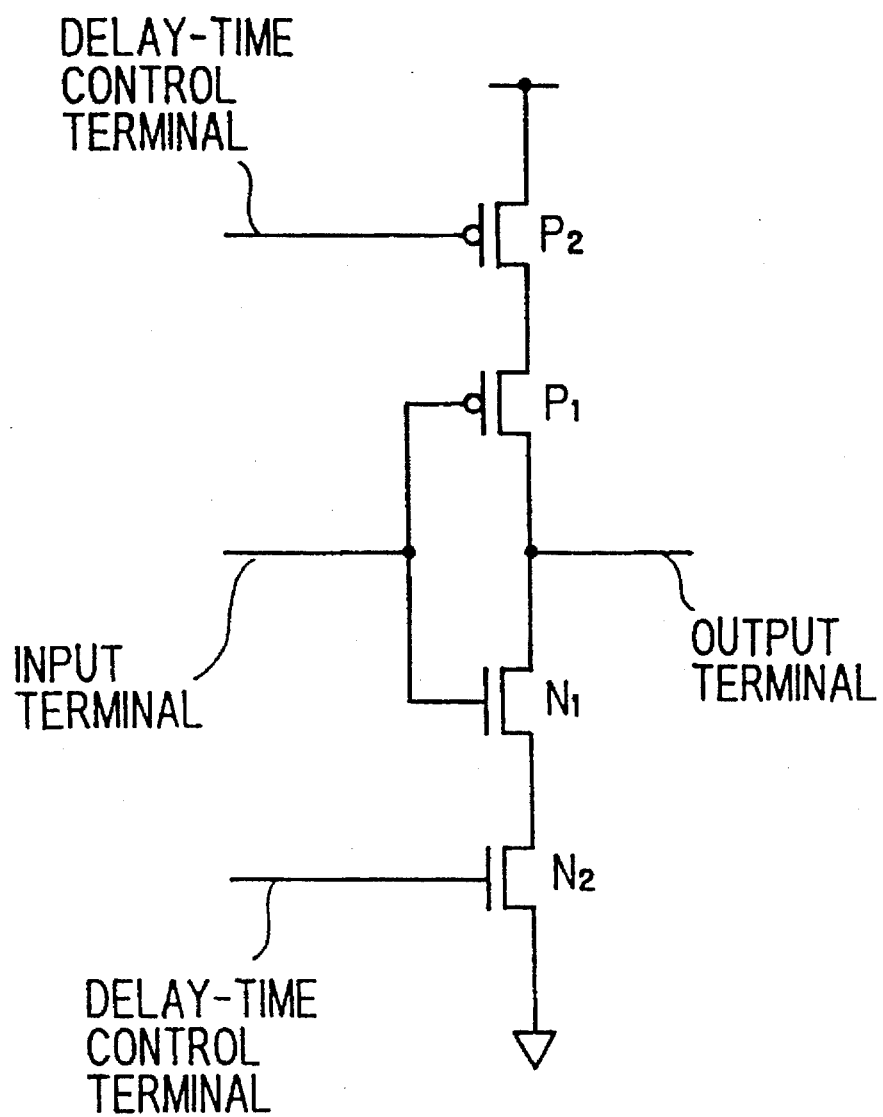
FIG. 9 is a circuit diagram showing an another example of an amplifier element.

Examples of amplifier elements which may comprise voltage-controlled oscillators in FIGS. 2 to 7 are shown in FIGS. 8 and 9. In FIG. 8, the amplifier element comprises an inverter gate which includes a P-channel transistor $P_1$, and a N-channel transistor $N_1$, a N-channel transistor $N_2$ and a capacitor C. In FIG. 9, the amplifier element comprises an inverter gate which includes a P-channel transistor $P_1$ and N-channel transistor $N_1$, and P- and N-channel transistors $P_2$ and $N_2$. The amplifier element is not limited to the examples, and any amplifier elements may be used if they have input and output terminals and delay-time control terminals and can function as inverting amplifiers and control a delay time from outside by employing a voltage-controlled oscillator.

Figure 2A:
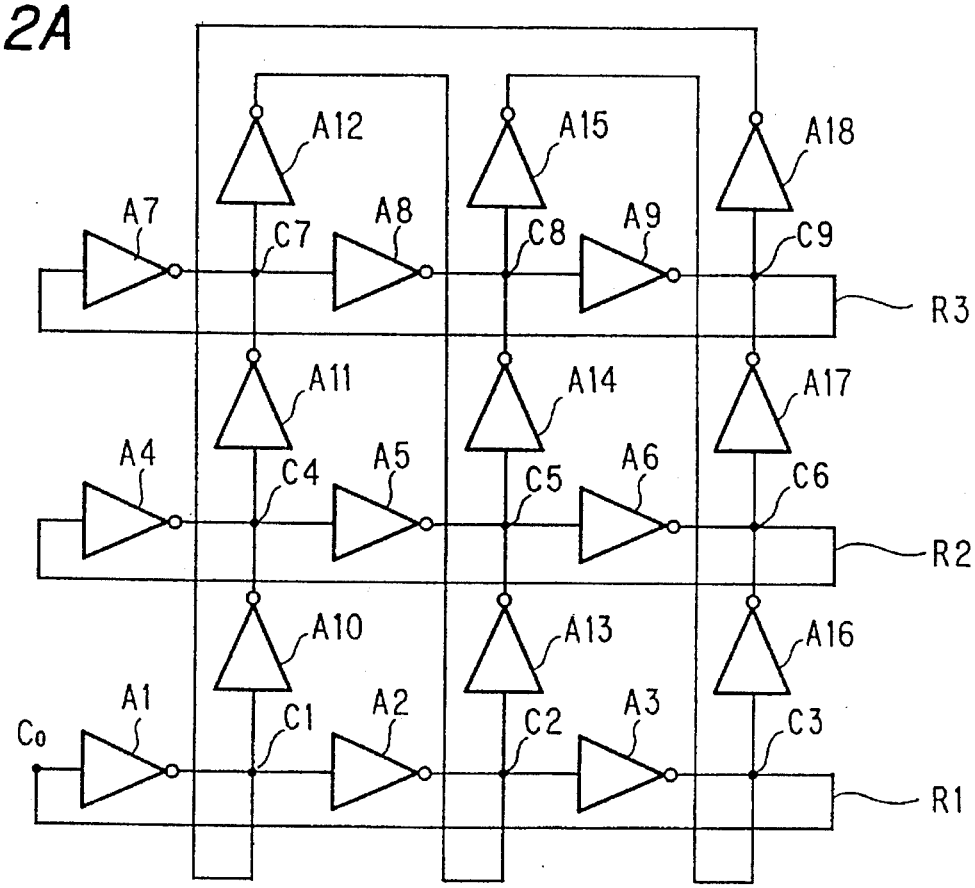
FIG. 2A is a circuit diagram showing a voltage-controlled oscillator in a first preferred embodiment according to the invention.

Now referring to FIG. 2A, the voltage-controlled oscillator in the first embodiment comprises a ring oscillator R1 in which three amplifier elements A1, A2 and A3 are connected in the form of a ring, a ring oscillator R2 in which three amplifier elements A4, A5 and A6 are connected in the form of a ring and a ring oscillator R3 in which three amplifier elements A7, A8 and A9 are connected in the form of a ring. The respective output terminals of these 3×3 amplifier elements is in a predetermined way connected with each of amplifier elements A10 to A18 as shown in FIG. 2A.

The way of connecting with the respective amplifier elements A10 to A18 is as follows: First, optionally selecting two output terminals from the 3×3 amplifier elements which form three ring oscillators, wherein the two output terminals are not selected from the input and output terminals of one amplifier element, and wherein the two output terminals are not selected from the output terminals belonging to the same ring oscillator. Next, connecting the input and output terminals of one of the amplifier elements A10 to A18 to the optionally selected two output terminals. Then repeating the above procedures one or more times to form a network between the ring oscillators R1 to R3. C1 to C9 are nodes for the connections.

In the above connections, it is important that none of the two output terminals which are optionally selected from the output terminals of the 3×3 amplifier elements which form three ring oscillators have both in-phase and anti-phase paths between them, on condition that all the signal paths between the two output terminals selected do not pass more than one time through the same output terminal. Hereon, the in-phase path means a path that passes through an even number of amplifier element thereby presenting logical in-phase, and the anti-phase path means a path that passes through an odd number of amplifier element thereby presenting logical anti-phase. For example, in FIG. 2A, between the output terminals C7 and C9, there exists a path through an even number of amplifier elements A8 and A9 or A12, A13, A14, A9 but there does not exist a path through an odd number of amplifier element. On the contrary, between the output terminals C7 and C8, there exists a path through an odd number of amplifier element(s) A8 or A12, A13 and A14 but there does not exist a path through an even number of amplifier element.

Figure 2B:
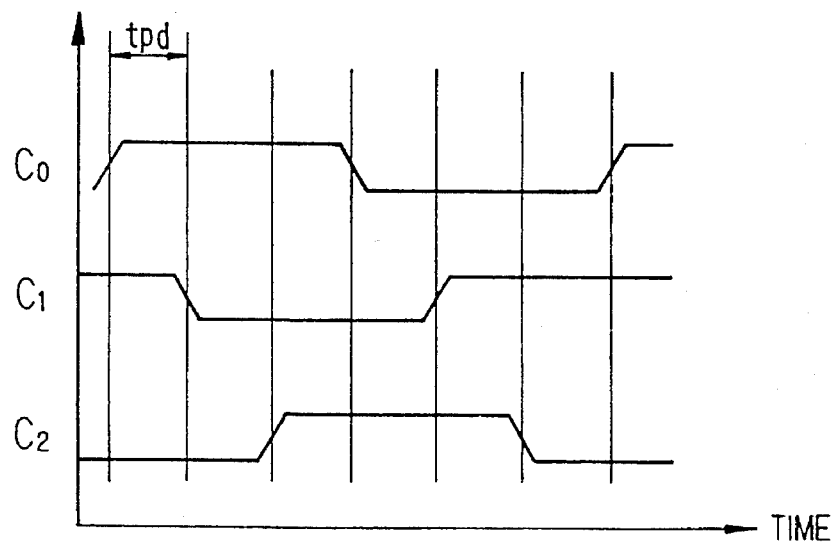
FIG. 2B is a illustration showing the delay of signal waves passing through a ring oscillator in FIG. 2A.

FIG. 2B is an illustration showing the delay of signal waves passing through a ring oscillator in FIG. 2A, where $C_0$ is an input and output of amplifier elements A1 and A3, respectively, $C_1$ is an output and input of amplifier elements A1 and A2, respectively, and $C_2$ is an output and input of amplifier elements A2 and A3, respectively, and $t_{pd}$ is a delay time at each amplifier element. As shown in FIG. 2B, at first period $t_{pd}$, $C_0$ and $C_1$ are H (high) and $C_2$ is L (low), and after period $t_{pd}$ $C_1$ is inverted to L. Thereafter $C_2$ delays for $t_{pd}$ to be inverted to H, followed by an output from amplifier element A3(=$C_0$) which is inverted to L after period $t_{pd}$. Thus, signals $C_0$, $C_1$ and $C_2$ are oscillated by taking a frequency f, $f=1/(2Nt_{pd})$ where N is 3 at this example. Accordingly, a voltage-controlled oscillator can be established by controlling the delay time $t_{pd}$ of each amplifier element from outside.

Figure 3:
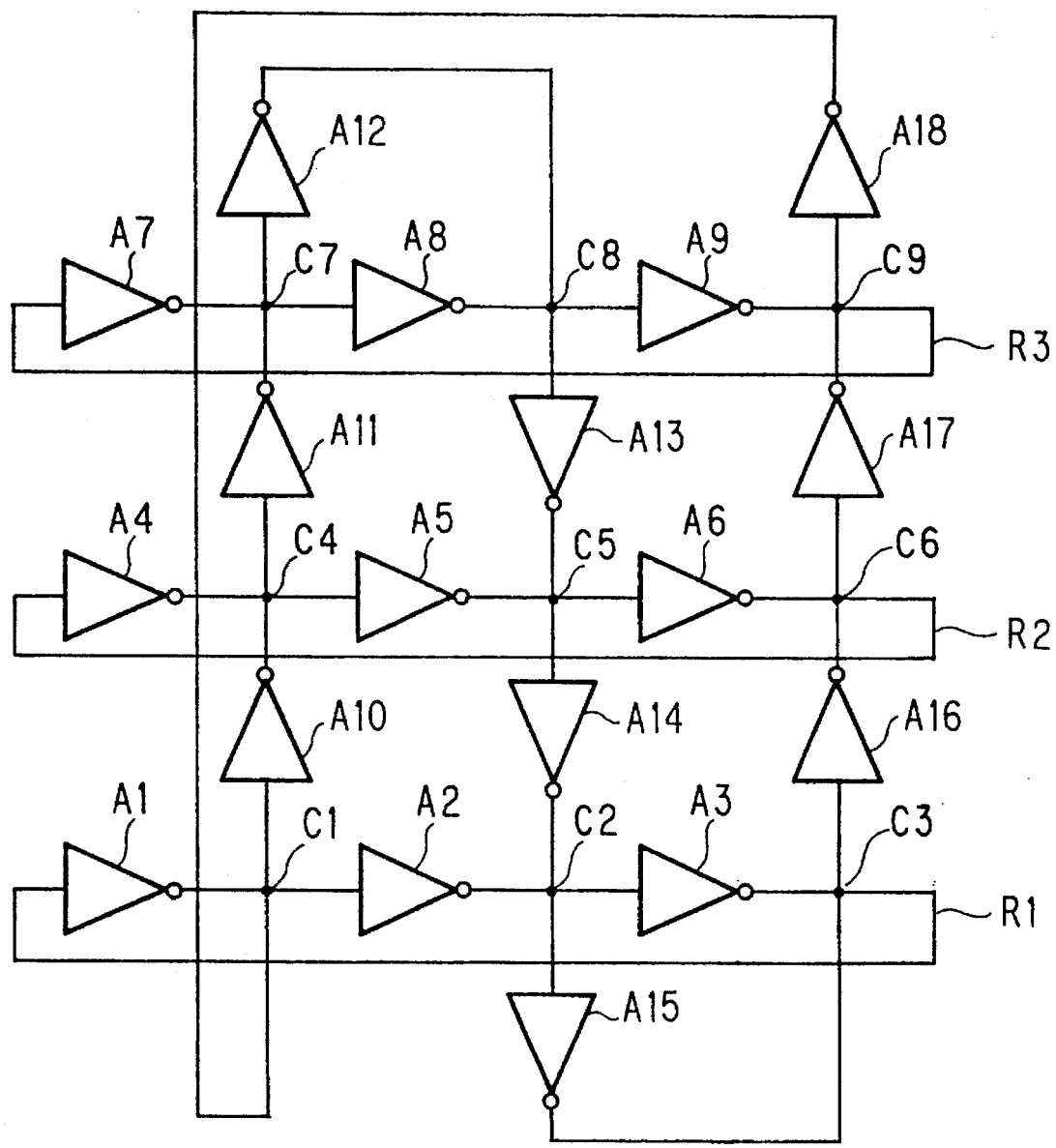
FIG. 3 is a circuit diagram showing a voltage-controlled oscillator in a second preferred embodiment according to the invention.

With reference to FIG. 3, the voltage-controlled oscillator in the second embodiment comprises a ring oscillator R1 in which three amplifier elements A1, A2 and A3 are connected in the form of a ring, a ring oscillator R2 in which three amplifier elements A4, A5 and A6 are connected in the form of a ring and a ring oscillator R3 in which three amplifier elements A7, A8 and A9 are connected in the form of a ring. The respective output terminals of these 3×3 amplifier elements is in a predetermined way connected with each of the amplifier elements A10 to A18 as shown in FIG. 3.

The way for connecting the respective amplifier elements A10 to A18 is as follows: First, optionally selecting two output terminals from the 3×3 amplifier elements which form three ring oscillators, wherein the two output terminals are not selected from the input and output terminals of one amplifier element, and wherein the two output terminals are not selected from the output terminals belonging to the same ring oscillator. Next, connecting the input and output terminals of one of the amplifier elements A10 to A18 to the optionally selected two output terminals. Then repeating the above procedures one or more times to form a network between the ring oscillators R1 to R3. C1 to C9 are nodes for the connections.

In the above connections, it is important that none of the two output terminals which are optionally selected from the output terminals of the 3×3 amplifier elements which form three ring oscillators have both in-phase and anti-phase paths through between them, on condition that all the signal paths between the two output terminals selected do not pass more than one time through the same output terminal.

Figure 4:
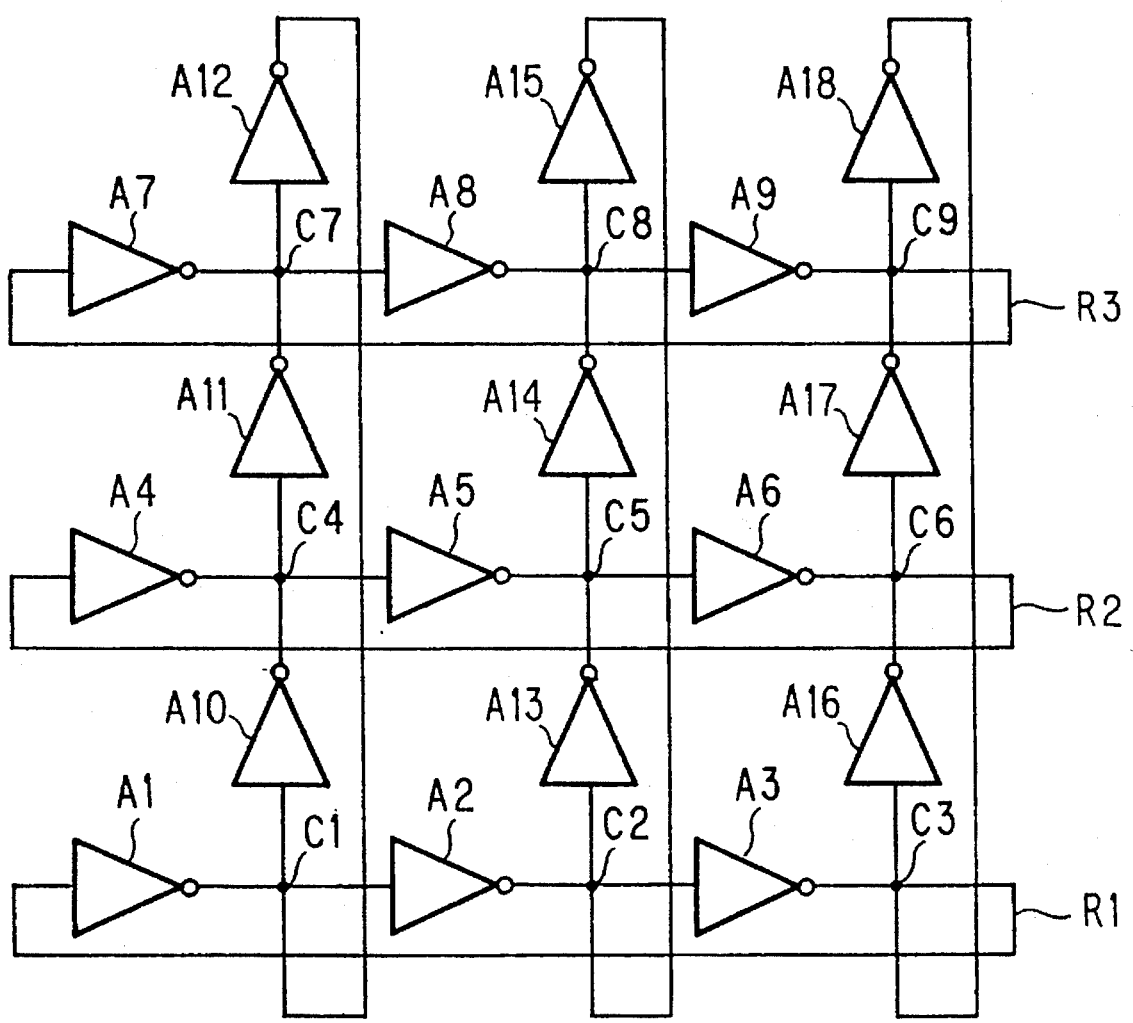
FIG. 4 is a circuit diagram showing a voltage-controlled oscillator in a third preferred embodiment according to the invention.

With reference to FIG. 4, the voltage-controlled oscillator in the third embodiment comprises a ring oscillator R1 in which three amplifier elements A1, A2 and A3 are connected in the form of a ring, a ring oscillator R2 in which three amplifier elements A4, A5 and A6 are connected in the form of a ring and a ring oscillator R3 in which three amplifier elements A7, A8 and A9 are connected in the form of a ring. The respective output terminals of these 3×3 amplifier elements is in a predetermined way connected with each of another amplifier elements A10 to A18 as shown in FIG. 4.

The way of connecting with the respective amplifier elements A10 to A18 is as follows: First, optionally selecting two output terminals from the 3×3 amplifier elements which form three ring oscillators, wherein the two output terminals are not selected from the input and output terminals of one amplifier element, and wherein the two output terminals are not selected from the output terminals belonging to the same ring oscillator. Next, connecting the input and output terminals of one of the amplifier elements A10 to A18 to the optionally selected two output terminals. Then repeating the above procedures 3×3 times to form a network between the ring oscillators R1 to R3. However, after forming the network, more than three input or output terminals of the 3×3 amplifier elements are not included into any loop being formed by the amplifier elements A1 to A18. C1 to C9 are nodes for the connections.

In the above connections, it is important that none of the two output terminals which are optionally selected from the output terminals of the 3×3 amplifier elements which form three ring oscillators have both in-phase and anti-phase paths through between them, on condition that all the signal paths between the two output terminals selected does not pass more than one time through the same output terminal.

Figure 5:
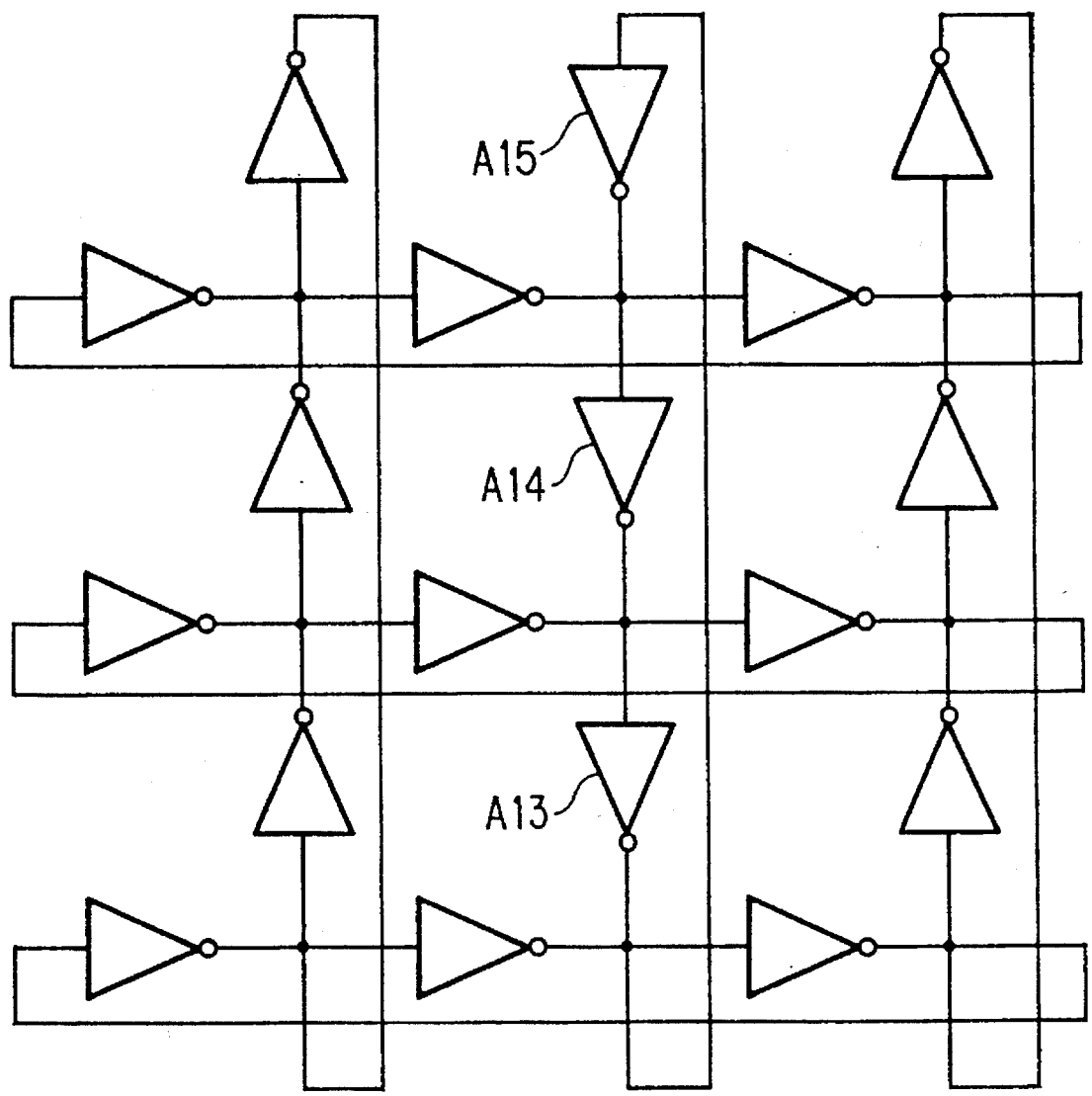
FIG. 5 is a circuit diagram showing a voltage-controlled oscillator in a fourth preferred embodiment according to the invention.

The voltage-controlled oscillator in the fourth embodiment shown in FIG. 5 is in general similar to that shown in FIG. 4 but the direction of connection of amplifier elements A13, A14 and A15 is reversed as compared with that in FIG. 4.

With reference to FIG. 6, the voltage-controlled oscillator in the fifth embodiment comprises a ring oscillator R1 in which three amplifier elements A1, A2 and A3 are connected in the form of a ring, a ring oscillator R2 in which three amplifier elements A4, A5 and A6 are connected in the form of a ring, a ring oscillator R3 in which three amplifier elements A7, A8 and A9 are connected in the form of a ring, a delay unit D1 in which two amplifier elements A10 and A11 are linearly connected, a delay unit D2 in which two amplifier elements A12 and A13 are linearly connected and a delay unit D3 in which two amplifier elements A14 and A15 are linearly connected, wherein the amplifier elements are connected so that they form two-dimensional network.

The input terminal of the delay unit D1 is connected to the output terminal of the amplifier element A1 and the output terminal of the delay is connected to the output of the amplifier element A7. The input terminal of the delay unit D2 is connected to the output terminal of the amplifier element A2 and the output terminal of the delay is connected to the output of the amplifier element A8. The input terminal of the delay unit D3 is connected to the output terminal of the amplifier element A3 and the output terminal of the delay is connected to the output of the amplifier element A9.

In the above connections, it is important that none of the two output terminals which are optionally selected from the output terminals of the 3×3 amplifier elements which form three ring oscillators have both in-phase and anti-phase paths through between them, on condition that all the signal paths between the two output terminals selected do not pass more than one time through the same output terminal.

The voltage-controlled oscillator in the sixth embodiment shown in FIG. 7 is in general similar to that shown in FIG. 6 but the direction of connection of a delay unit D2 which is formed of amplifier elements A12 and A13 is reversed as compared with that in FIG. 6.

As described above, the voltage-controlled oscillators shown in FIGS. 2 to 7 are designed so that a plurality of ring oscillators are connected to one another and amplifier elements are thereby connected to form a network. Therefore, even if dispersed quality of a device, variation of voltage of a power supply, noise induced from outside, or the like affects to vary the delay time of the amplifier element which comprises the voltage-controlled oscillator, a temporal fluctuation of output clock can be prevented. In particular, when output is obtained from output terminals of a plurality of amplifier elements, a temporal timing fluctuation between signals obtained from output terminals can significantly be reduced.

In addition, in the voltage-controlled oscillators shown in FIGS. 2 to 7, at each node of the amplifier element, there is provided a plurality of signal paths through between a node and another node. This allows an affection of a dispersion of an amplifier element existing on a path to output clock, i.e., a temporal fluctuation of output clock can be prevented. Furthermore, there exist nodes which have the same phase, and there exists an amplifier element which connects between the nodes having the same phase. Even if the phase of the nodes which should originally have the same phase is varied by dispersed quality of device, variation of voltage of a power supply, a noise induced from outside, or the like, the amplifier elements which connect between the nodes can prevent the variation to reduce a temporal fluctuation of output clock.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A voltage-controlled oscillator, comprising:

oscillators of number M, where M is an integer, each of which includes amplifier elements of odd number N, where N is an integer, which function as inverting amplifiers and are connected in the form of a ring, and which include an input terminal, an output terminal and a delay-time control terminal, wherein delay time is externally controlled through said delay-time control terminal, wherein said oscillators form a network by repeating one or more times a procedure that two output terminals are optionally selected from said amplifier elements of total number M×N, said two output terminals not being input and output terminals of one of said amplifier elements and not being output terminals belonging to one of said oscillators, then said two output terminals are connected to input and output terminals of another of said amplifier elements, wherein none of said two output terminals have both in-phase and anti-phase paths through between them, on condition that all signal paths laid between said two output terminals do not pass more than one time through said same output terminal.

2. A voltage-controlled oscillator, comprising:

oscillators of number M, where M is an integer, each of which includes amplifier elements of odd number N, where N is an integer, which function as inverting amplifiers and are connected in the form of a ring, and which include an input terminal, an output terminal and a delay-time control terminal, wherein delay time is externally controlled through said delay-time control terminal, wherein said oscillators form a network by repeating M×N times a procedure that two output terminals are optionally selected from said amplifier elements of total number M×N, said two output terminals not being input and output terminals of one of said amplifier elements and not being output terminals belonging to one of said oscillators, then said two output terminals are connected to input and output terminals of another of said amplifier elements, wherein more than three of input or output terminals of said amplifier elements of total number M×N are not included into any loop being formed by said amplifier elements, wherein none of said two output terminals have both in-phase and anti-phase paths through between them, on condition that all signal paths laid between said two output terminals do not pass more than one time through said same output terminal.

3. A voltage-controlled oscillator, comprising:

oscillators of number M, where M is an integer, each of which includes amplifier elements of odd number N, where N is an integer, which function as inverting amplifiers and are connected in the form of a ring, and which include an input terminal, an output terminal and a delay-time control terminal, wherein delay time is externally controlled through said delay-time control terminal, and delay units of number N each of which includes amplifier elements of odd number M which function as inverting amplifiers and are linearly connected, and which include an input terminal, an output terminal and a delay-time control terminal, wherein delay time is externally controlled through said delay-time control terminal, wherein said amplifier elements are connected to form a two-dimensional network, an output terminal of one of said delay units is connected to an input terminal of another of said delay units in which said input terminal is not connected, and wherein none of two output terminals optionally selected from M×N amplifier elements which are included in said oscillators of number M have both in-phase and anti-phase paths through between them, on condition that all signal paths laid between said two output terminals do not pass more than one time through said same output terminal.

4. A voltage-controlled oscillator, comprising:

oscillators of number M, where M is an even integer greater than 1, each of which includes amplifier elements of odd number N, where N is an integer, which function as inverting amplifiers and are connected in the form of a ring, and which include an input terminal, an output terminal and a delay-time control terminal, wherein delay time is externally controlled through said delay-time control terminal, and delay units of number N each of which includes amplifier elements of odd number M−1 which are linearly connected, and which include an input terminal, an output terminal and a delay-time control terminal, wherein delay time is externally controlled through said delay-time control terminal, wherein respective input and output terminals of each of said delay units are connected to one of output terminals of M×N amplifier elements which are included in said oscillators of number M, said amplifier elements are connected to form a two-dimensional network, and wherein none of two output terminals optionally selected from said M×N amplifier elements have both in-phase and anti-phase paths through between them, on condition that all signal paths laid between said two output terminals do not pass more than one time through said same output terminal.

* * * * *